(12) United States Patent
Park et al.

(10) Patent No.: US 10,991,574 B2
(45) Date of Patent: Apr. 27, 2021

(54) METHODS OF MANUFACTURING SEMICONDUCTOR DEVICES

(71) Applicant: Samsung Electronics Co., Ltd., Suwon-si (KR)

(72) Inventors: Ji-woon Park, Seoul (KR); Jin-su Lee, Hwaseong-si (KR); Hyung-suk Jung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/407,700

(22) Filed: May 9, 2019

(65) Prior Publication Data

US 2020/0111660 A1  Apr. 9, 2020

(30) Foreign Application Priority Data

Oct. 4, 2018 (KR) ........................ 10-2018-0118139

(51) Int. Cl.
| | | |
|---|---|---|
| *H01L 21/02* | (2006.01) | |
| *C23C 16/04* | (2006.01) | |
| *H01L 21/768* | (2006.01) | |
| *H01L 21/285* | (2006.01) | |
| *H01L 49/02* | (2006.01) | |

(52) U.S. Cl.
CPC ........ *H01L 21/0228* (2013.01); *C23C 16/045* (2013.01); *H01L 21/0262* (2013.01); *H01L 21/02274* (2013.01); *H01L 21/02296* (2013.01); *H01L 21/28556* (2013.01); *H01L 21/76843* (2013.01); *H01L 28/91* (2013.01)

(58) Field of Classification Search
None
See application file for complete search history.

(56) References Cited

U.S. PATENT DOCUMENTS

| | | |
|---|---|---|
| 5,970,374 A | 10/1999 | Teo |
| 9,385,219 B2 | 7/2016 | Yieh et al. |
| 9,472,392 B2 | 10/2016 | Wang et al. |
| 9,543,148 B1 | 1/2017 | Hudson et al. |
| 2006/0292810 A1 | 12/2006 | Seo et al. |
| 2009/0140397 A1* | 6/2009 | Sukekawa ......... H01L 21/76834 257/637 |
| 2016/0005609 A1* | 1/2016 | Di ..................... H01L 21/02271 438/17 |
| 2018/0061628 A1 | 3/2018 | Ou et al. |
| 2018/0130707 A1 | 5/2018 | Clendenning et al. |
| 2018/0331186 A1* | 11/2018 | Srivastava .......... H01L 29/7786 |

FOREIGN PATENT DOCUMENTS

| | | |
|---|---|---|
| KR | 100762227 B1 | 10/2007 |
| KR | 100763506 B1 | 10/2007 |

* cited by examiner

*Primary Examiner* — Alexander G Ghyka
(74) *Attorney, Agent, or Firm* — Harness, Dickey & Pierce, P.L.C.

(57) ABSTRACT

A method of manufacturing a semiconductor device includes forming a three-dimensional (3D) structure on a substrate, forming an adsorption control layer to cover an upper portion of the 3D structure, and forming a material layer on the adsorption control layer and on a lower portion of the 3D structure that is not covered by the adsorption control layer, wherein a minimum thickness of the material layer on the adsorption control layer is less than a maximum thickness of the material layer on the lower portion of the 3D structure.

14 Claims, 24 Drawing Sheets

METHODS OF MANUFACTURING SEMICONDUCTOR DEVICES

CROSS-REFERENCE TO RELATED APPLICATION

This application claims the benefit of Korean Patent Application No. 10-2018-0118139, filed on Oct. 4, 2018, in the Korean Intellectual Property Office, the disclosure of which is incorporated herein in its entirety by reference.

BACKGROUND

The inventive concepts relate to methods of manufacturing semiconductor devices, and more particularly, to methods of manufacturing semiconductor devices, which may improve step coverage.

When a material layer is formed on a three-dimensional (3D) structure, a step coverage may be defined as a ratio of a minimum thickness of the material layer to a maximum thickness of the material layer. The step coverage may be one of the measurements of thickness uniformity of the formed material layer. As an aspect ratio of the 3D structure increases, the step coverage may be reduced. Thus, when the material layer is formed on a 3D structure having a high aspect ratio, obtaining a high coverage may be significant.

SUMMARY

The inventive concepts provide methods of manufacturing semiconductor devices, which may improve step coverage.

According to an aspect of the inventive concepts, there is provided a method of manufacturing a semiconductor device. The method includes forming a three-dimensional (3D) structure on a substrate, forming an adsorption control layer to cover an upper portion of the 3D structure, and forming a material layer on the adsorption control layer and on a lower portion of the 3D structure that is not covered by the adsorption control layer. A minimum thickness of the material layer on the adsorption control layer is less than a maximum thickness of the material layer on the lower portion of the 3D structure.

According to another aspect of the inventive concepts, there is provided a method of manufacturing a semiconductor device. The method includes forming a lower electrode having a pillar shape, forming a first portion of a dielectric layer on an upper portion of the lower electrode and forming a second portion of the dielectric layer on a lower portion of the lower electrode, forming an adsorption control layer on the first portion of the dielectric layer, and forming an upper electrode on the adsorption control layer and on the second portion of the dielectric layer. A growth rate of the upper electrode on an upper end of the adsorption control layer is lower than a growth rate of the upper electrode on a boundary between the first portion and the second portion of the dielectric layer.

According to another aspect of the inventive concepts, there is provided a method of manufacturing a semiconductor device. The method includes forming a lower electrode having a hollow pillar shape with a bottom, forming a first portion of a dielectric layer on an upper portion of the lower electrode and forming a second portion of the dielectric layer on a lower portion of the lower electrode, forming an adsorption control layer on the first portion of the dielectric layer, and forming an upper electrode on the adsorption control layer and on the second portion of the dielectric layer. A minimum thickness of the upper electrode on the adsorption control layer is less than a maximum thickness of the upper electrode on the second portion of the dielectric layer.

BRIEF DESCRIPTION OF THE DRAWINGS

Embodiments of the inventive concepts will be more clearly understood from the following detailed description taken in conjunction with the accompanying drawings in which:

FIGS. 3A to 5 are diagrams of a method of manufacturing a semiconductor device, according to an embodiment, wherein

FIGS. 8A to 10 are diagrams illustrating a method of manufacturing a semiconductor device, according to an embodiment, wherein

DETAILED DESCRIPTION

Figure 1:
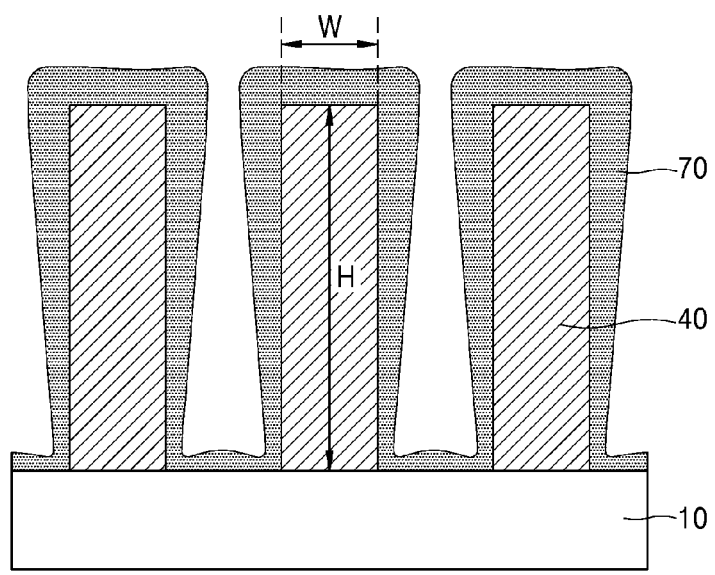
FIG. 1 is a cross-sectional view of a material layer deposited using a typical deposition process on a three-dimensional (3D) structure formed on a substrate.

FIG. 1 is a cross-sectional view of a material layer 70 deposited using a typical deposition process on a three-dimensional (3D) structure 40 formed on a substrate 10. Referring to FIG. 1, a thickness of the material layer 70 deposited on an upper end of the 3D structure 40 may be greater than a thickness of the material layer 70 deposited on a lower end of the 3D structure 40. Also, a thickness of the material layer 70 formed on the 3D structure 40 may be reduced toward the lower end of the 3D structure 40, that is, toward the substrate 10. This phenomenon may occur partially because a chemical material for forming the material layer 70 is consumed on an upper portion of the 3D structure 40 and is not sufficiently supplied to a lower portion of the 3D structure 40.

A step coverage may be defined as a ratio of a minimum thickness of the material layer 70 to a maximum thickness of the material layer 70. For example, the step coverage may be a ratio of a thickness of the material layer 70 formed on the lower end of the 3D structure 40 to a thickness of the material layer 70 formed on the upper end of the 3D structure 40. As an aspect ratio of the 3D structure 40 increases, the step coverage may be reduced. Here, the aspect ratio may be defined as a ratio of a height H of the 3D structure 40 to a width W of the 3D structure 40.

Figure 2:
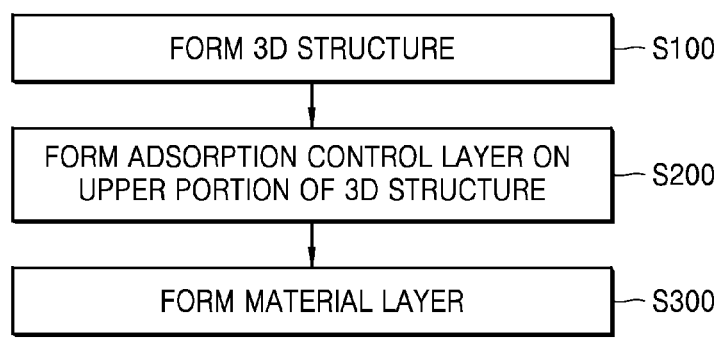
FIG. 2 is a flowchart of a method of manufacturing a semiconductor device, according to an embodiment.

FIG. 2 is a flowchart of a method of manufacturing a semiconductor device, according to an embodiment.

Referring to FIG. 2, the method of manufacturing the semiconductor device according to embodiments may include forming a 3D structure (S100), forming an adsorption control layer on an upper portion of the 3D structure (S200), and/or forming a material layer on the adsorption control layer and a lower portion of the 3D structure (S300). Each operation will be described in detail below with reference to FIGS. 3A to 7.

Figure 3A:
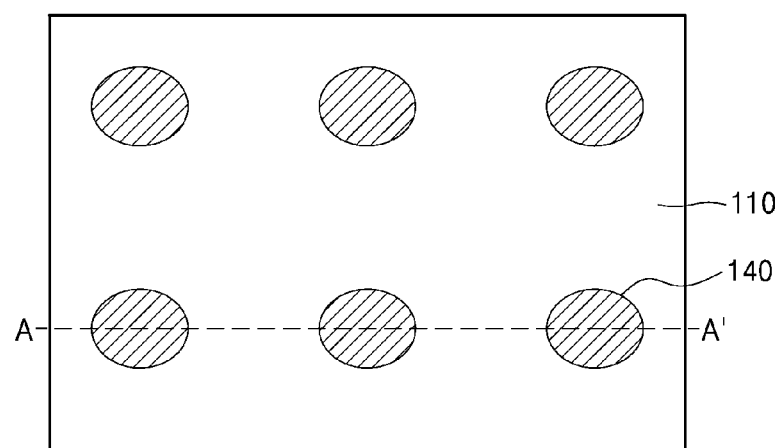
Figure 3A:
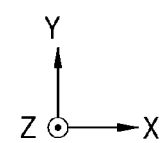
Figure 3B:
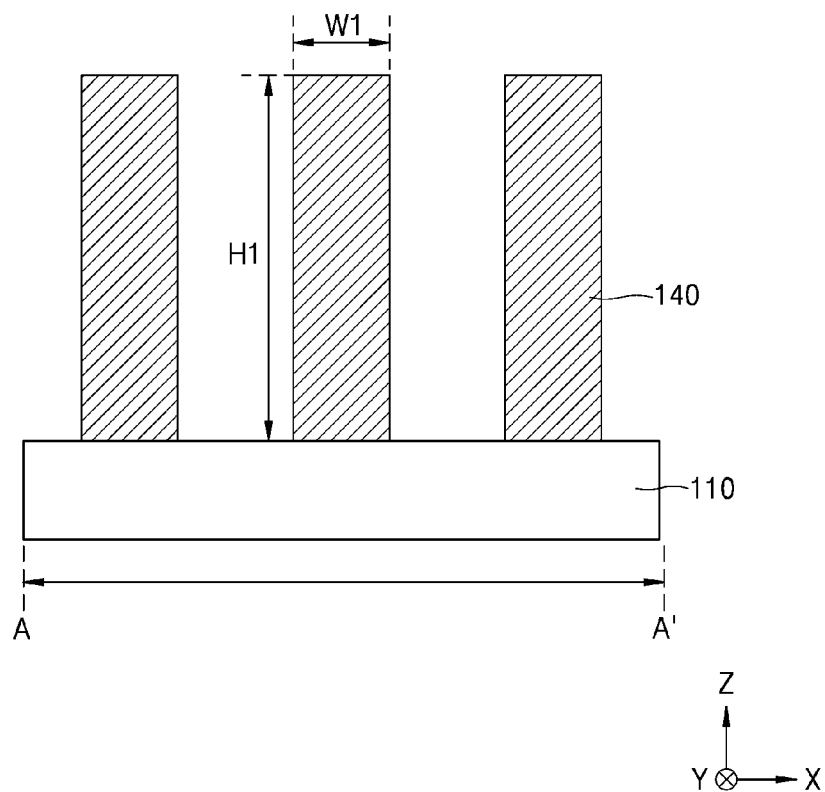
FIG. 3B is a cross-sectional view taken along a line AA' of FIG. 3A.
Figure 6:
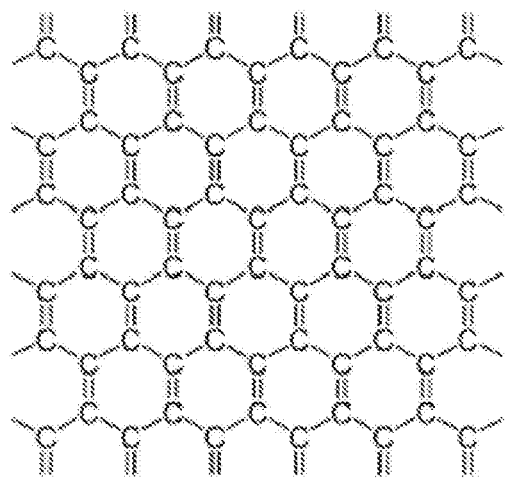
FIG. 6 is a diagram of a chemical structure of graphene.
Figure 7:
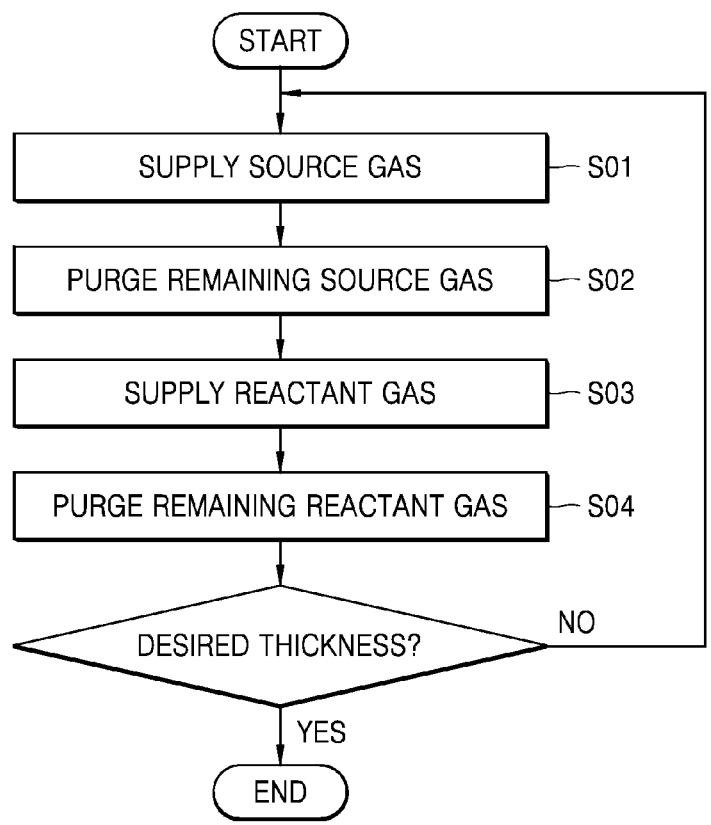
FIG. 7 is a flowchart of an operation of forming a material layer according to an embodiment.

FIGS. 3A to 5 are diagrams illustrating a method of manufacturing a semiconductor device, according to an embodiment, and FIG. 3B is a cross-sectional view taken along a line AA' of FIG. 3A. FIG. 6 is a diagram of a chemical structure of graphene. FIG. 7 is a flowchart of an operation of forming a material layer according to an embodiment.

Referring to FIGS. 3A and 3B, a 3D structure 140 may be formed on a substrate 110. The substrate 110 may include an arbitrary material. For example, the substrate 110 may include a ceramic material, an organic material, a metal material, a metal compound material, a semiconductor material, or a combination thereof, but the inventive concepts are not limited thereto. The 3D structure 140 may also include an arbitrary material. For instance, the 3D structure 140 may include a ceramic material, an organic material, a metal material, a metal compound material, a semiconductor material, or a combination thereof, but the inventive concepts are not limited thereto.

The 3D structure 140 may include a single structure or a plurality of discrete structures. In some embodiments, the 3D structure 140 may be a portion of the substrate 110. In some other embodiments, the 3D structure 140 may not be the portion of the substrate 110 but include at least one independent structure.

Although FIGS. 3A and 3B illustrate a case in which the 3D structure 140 has a pillar shape, for example, a cylindrical shape, a shape of the 3D structure 140 is not limited thereto and may be variously modified. For example, the 3D structure 140 may have a tetragonal pillar shape, a hexagonal pillar shape, or a more complicated shape than the tetragonal or hexagonal pillar shape. The 3D structure 140 may have a shape having a relatively high aspect ratio. The aspect ratio may be defined as a ratio of a height H1 of the 3D structure 140 to a width W1 of the 3D structure 140. For example, the aspect ratio H1/W1 of the 3D structure 140 may be between about 1 and about 1000, but is not limited thereto.

The 3D structure 140 may be surrounded by a plurality of 3D structures 140 located adjacent thereto. The arrangement of the 3D structures 140 is not limited to that which is shown in FIG. 3A, and may be variously modified.

Figure 4:
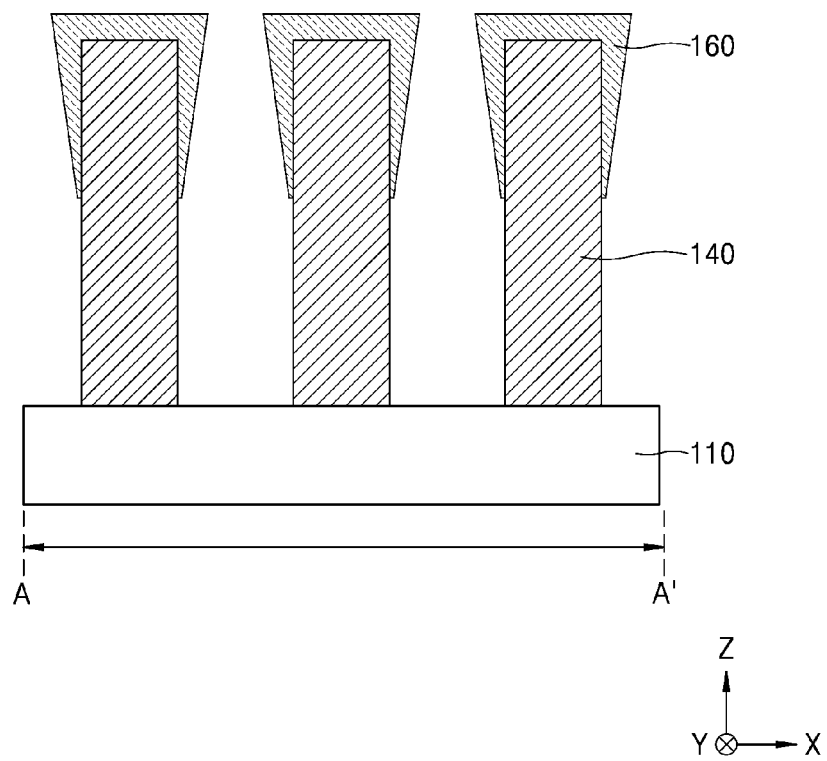

Referring to FIGS. 4 and 6, an adsorption control layer 160 may be formed on the 3D structure 140. The adsorption control layer 160 may be formed on an upper portion of the 3D structure 140 but not on a lower portion of the 3D structure 140. As used herein, an upper portion of an object refers to a portion of the object, which is further from the substrate 110 than a lower portion of the object, and a lower portion of the object refers to a portion of the object, which is closer to the substrate 110 than the upper portion of the object. For example, the upper portion of the 3D structure 140 may refer to a portion of the 3D structure 140, which is at least a predetermined (or alternatively, given) distance from the substrate 110. The adsorption control layer 160 may be formed on an upper portion of one or more side surfaces and an upper surface of the 3D structure 140.

The adsorption control layer 160 may be an arbitrary material causing the less adsorption of a chemical material on a surface of the adsorption control layer 160 more effectively than on a surface of the 3D structure 140. In some embodiments, the adsorption control layer 160 may be a 2D material. The 2D material may be, for example, a transition metal dichalcogenide, graphene, phosphorene, boron nitride, or a combination thereof, but the inventive concepts are not limited thereto.

The 2D material may include at least one atomic layer, which may include atoms bonded to each other on a plane. For example, graphene may include an atomic layer shown in FIG. 6. Each carbon atom may be bonded to three carbon atoms on the same plane.

Atoms on a surface of a material having 3D crystals may not form a sufficient number of bonds unlike atoms inside the material having the 3D crystals. Accordingly, the atoms on the surface of the material having the 3D crystals may be bonded to functional groups (e.g., hydroxyl (OH) groups) capable of acting as adsorption sites. By contrast, atoms on a surface of a 2D material (e.g., graphene) may form a sufficient number of bonds with atoms in the same atomic layer. Thus, the atoms on the surface of the 2D material may be hardly or never bonded to functional groups capable of acting as adsorption sites. Accordingly, a chemical material may not be adsorbed on the 2D material or may be limitedly adsorbed. Since the 2D material also includes defects, atoms around the defects may not form a sufficient number of bonds and may be bonded to functional groups capable of acting as adsorption sites. Therefore, a small amount of chemical may be adsorbed on the 2D material, and as there are more defects on the surface of the 2D material, the adsorbed amount of chemical material may increase. However, the inventive concepts are not intended to be limited by a specific theory.

In some embodiments, the adsorption control layer 160 may be formed on a catalyst. For example, a catalytic layer may be formed on an upper portion of the 3D structure 140, and the adsorption control layer 160 may be formed on the catalytic layer. The catalyst may be, for example, a metal or an organic metal compound. When the adsorption control layer 160 is formed using the catalyst, the catalyst may be present between the 3D structure 140 and the adsorption control layer 160 unlike that which is shown. In some other embodiments, the adsorption control layer 160 may be directly formed on the 3D structure 140 without the catalyst. In some embodiments, a chemical vapor deposition (CVD) process or other typical deposition processes may be used to form the adsorption control layer 160. For example, the adsorption control layer 160 may be deposited to a small thickness using a deposition method having a low step coverage so that the adsorption control layer 160 may be formed only on the upper portion of the 3D structure 140. Also, since the supplying of a chemical material is gradually reduced toward the lower portion of the 3D structure 140, a growth rate of the adsorption control layer 160 on the 3D structure 140 may be reduced toward the lower portion of the 3D structure 140. Accordingly, a thickness of the adsorption control layer 160 on the 3D structure 140 may be reduced toward the lower portion of the 3D structure 140.

Figure 5:
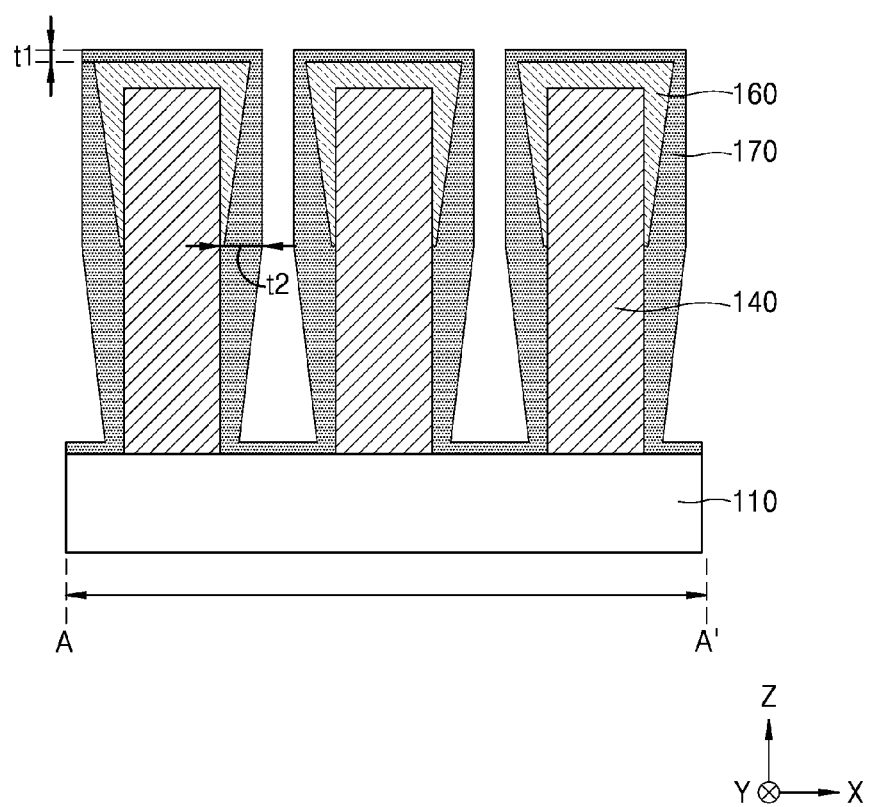

Referring to FIGS. 5 and 7, a material layer 170 may be formed on the adsorption control layer 160 and the lower portion of the 3D structure 140. In some embodiments, the material layer 170 may be formed using an atomic layer deposition (ALD) process. In some embodiments, the formation of the material layer 170 may include supplying a source gas (S01), purging an excess source gas (S02), supplying a reactant gas (S03), and/or purging an excess reactant gas (S04). Operations S01 to S04 may be sequentially repeated until the material layer 170 having a desired thickness is formed. The source gas may be referred to as a precursor gas. In some embodiments, an additional gas may be further used. An operation of supplying the additional gas and an operation of purging an excess additional gas may be further performed.

As described above, since only a small number of functional groups are capable of acting as adsorption sites on the adsorption control layer 160, the adsorption of the source gas on the adsorption control layer 160 may be more difficult than the adsorption of the source gas on the 3D structure 140. In addition, as a thickness of the adsorption control layer 160 increases, the number of defects on a surface of the adsorption control layer 160 may be reduced and thus, the adsorption of the source gas on the adsorption control layer 160 may be more difficult. Since the thickness of the adsorption control layer 160 is reduced toward the lower portion of the 3D structure 140, the density of defects on the surface of the adsorption control layer 160 may increase toward the lower portion of the 3D structure 140, and the density of the adsorption sites may increase toward the lower portion of the 3D structure 140. Accordingly, a growth rate of the material layer 170 on the adsorption control layer 160 may increase toward the lower portion of the 3D structure 140, and a thickness of the material layer 170 on the adsorption control layer 160 may increase toward the lower portion of the 3D structure 140. Accordingly, the material layer 170 on the adsorption control layer 160 may have a lowest growth rate and a minimum thickness at a position farthest from the substrate 110, that is, on an upper end of the 3D structure 140. Also, the material layer 170 on the adsorption control layer 160 may have a highest growth rate and a maximum thickness at a position closest to the substrate 110, that is, on a boundary between the lower portion and the upper portion of the 3D structure 140.

In addition, a growth rate and a thickness of the material layer 170 on the lower portion of the 3D structure 140 may increase toward the upper portion of the 3D structure 140 due to the fact that the supplying of the source gas and the reactant gas may be reduced toward a lower end of the 3D structure 140. Accordingly, the material layer 170 on the lower portion of the 3D structure 140 may have a lowest growth rate and a minimum thickness at a position closest to the substrate 110, that is, on the lower end of the 3D structure 140. Also, the material layer 170 on the lower portion of the 3D structure 140 may have a highest growth rate and a maximum thickness at a position farthest from the substrate 110, that is, at the boundary between the lower portion and the upper portion of the 3D structure 140.

A minimum thickness t1 of the material layer 170 on the adsorption control layer 160 may be less than a maximum thickness t2 of the material layer 170 on the lower portion of the 3D structure 140 due to the fact that a smaller amount of source is adsorbed to the adsorption control layer 160 than to the lower portion of the 3D structure 140. Here, the minimum thickness t1 of the material layer 170 on the adsorption control layer 160 may be a thickness of the material layer 170 on an upper end of the adsorption control layer 160, and the maximum thickness t2 of the material layer 170 on the lower portion of the 3D structure 140 may be a thickness of the material layer 170 at a boundary between the lower portion and the upper portion of the 3D structure 140. That is, a growth rate of the material layer 170 on the upper end of the adsorption control layer 160 may be lower than a growth rate of the material layer 170 at the boundary between the lower portion and the upper portion of the 3D structure 140.

In the method of manufacturing the semiconductor device according to some embodiments, the adsorption control layer 160 may be formed on the upper portion of the 3D structure 140. Since it is difficult to adsorb the source gas on the adsorption control layer 160, a larger amount of source gas may be supplied to the lower portion of the 3D structure 140 than when the adsorption control layer 160 is absent. Accordingly, a growth rate of the material layer 170 on the adsorption control layer 160 may be lower than a growth rate of the material layer 170 on the lower portion of the 3D structure 140. Accordingly, the material layer 170 may be formed to a sufficient thickness also on the lower portion of the 3D structure 140, and step coverage of the material layer 170 may be improved.

Figure 8A:
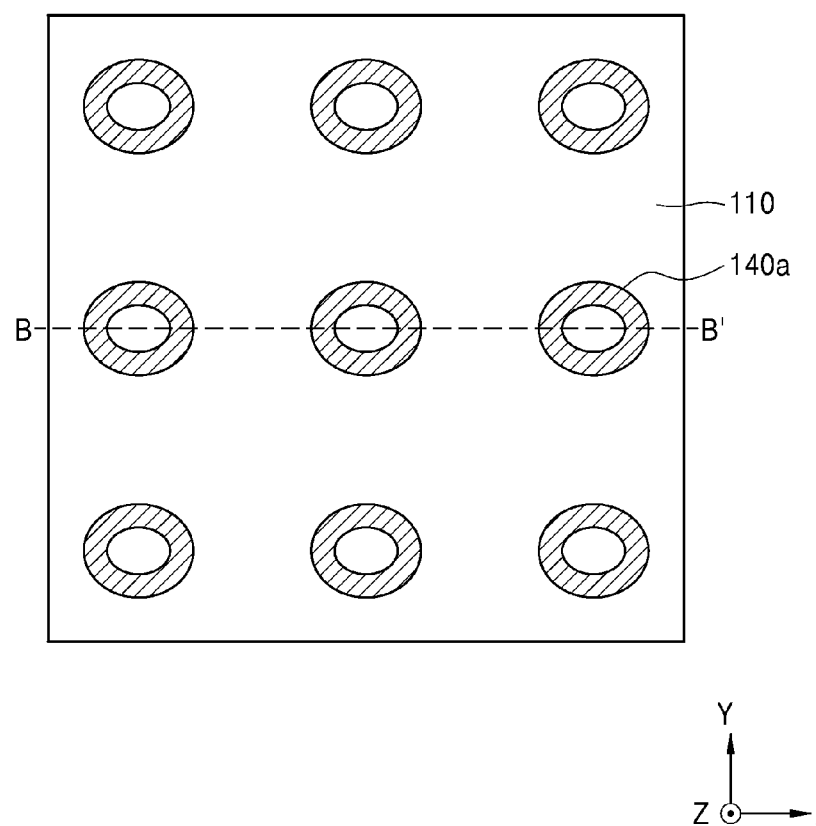
Figure 8B:
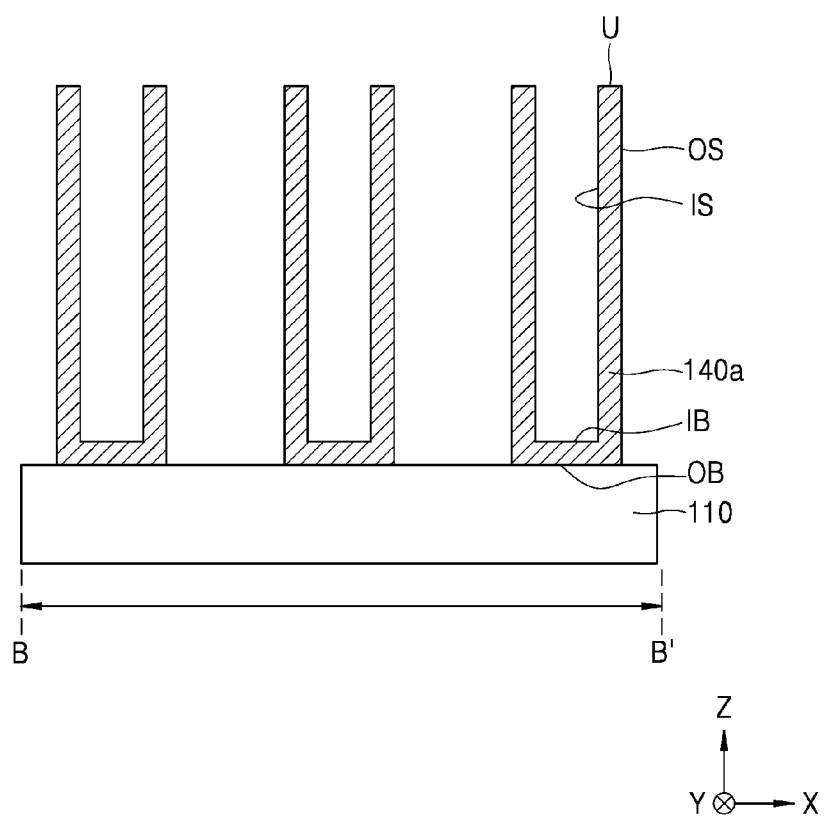
FIG. 8B is a cross-sectional view taken along a line BB' of FIG. 8A.

FIGS. 8A to 10 are diagrams illustrating a method of manufacturing a semiconductor device, according to an embodiment, and FIG. 8B is a cross-sectional view taken along a line BB' of FIG. 8A.

Referring to FIGS. 8A and 8B, a 3D structure 140a may be formed on a substrate 110. The 3D structure 140a may have a hollow pillar shape with a bottom. The 3D structure 140a may have an upper surface U, an outer side surface OS, an inner side surface IS, an inner bottom surface IB, and an outer bottom surface OB. The bottom of the 3D structure 140a may be between the inner bottom surface IB and the outer bottom surface OB, and a sidewall of the 3D structure 140a may be between the outer side surface OS and the inner side surface IS.

Figure 9:
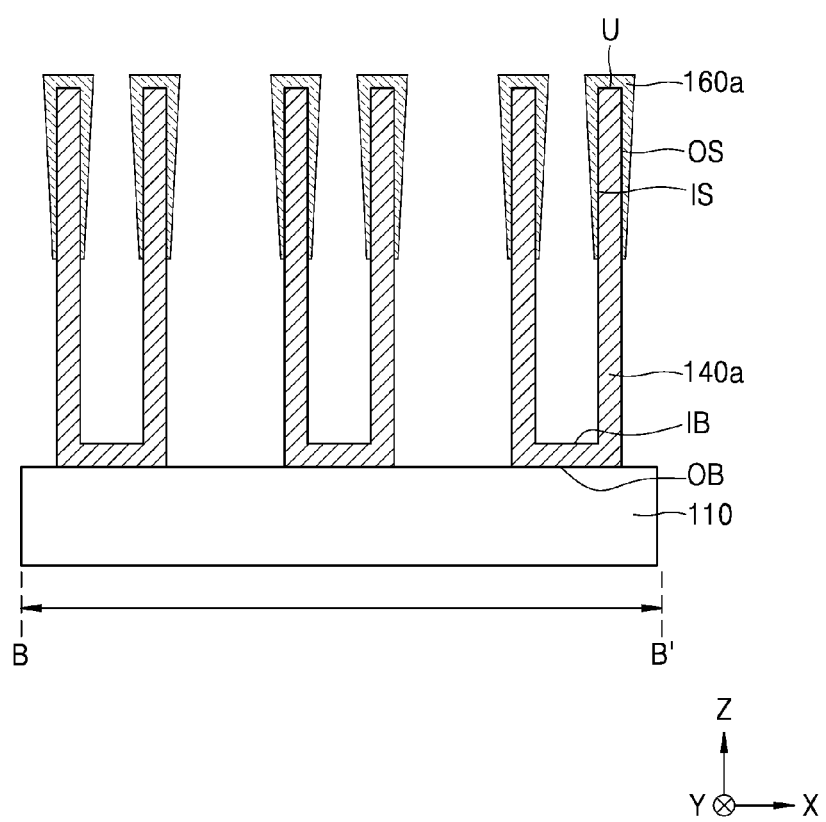

Referring to FIG. 9, an adsorption control layer 160a may be formed on an upper portion of the 3D structure 140a. The adsorption control layer 160a may be formed on an upper surface U, an upper portion of an outer side surface OS, and an upper portion of an inner side surface IS of the 3D structure 140a. Like the adsorption control layer 160 shown in FIG. 4, a growth rate of the adsorption control layer 160a on the 3D structure 140a may be reduced toward a lower portion of the 3D structure 140a, and a thickness of the adsorption control layer 160a may be reduced toward the lower portion of the 3D structure 140a.

Figure 10:
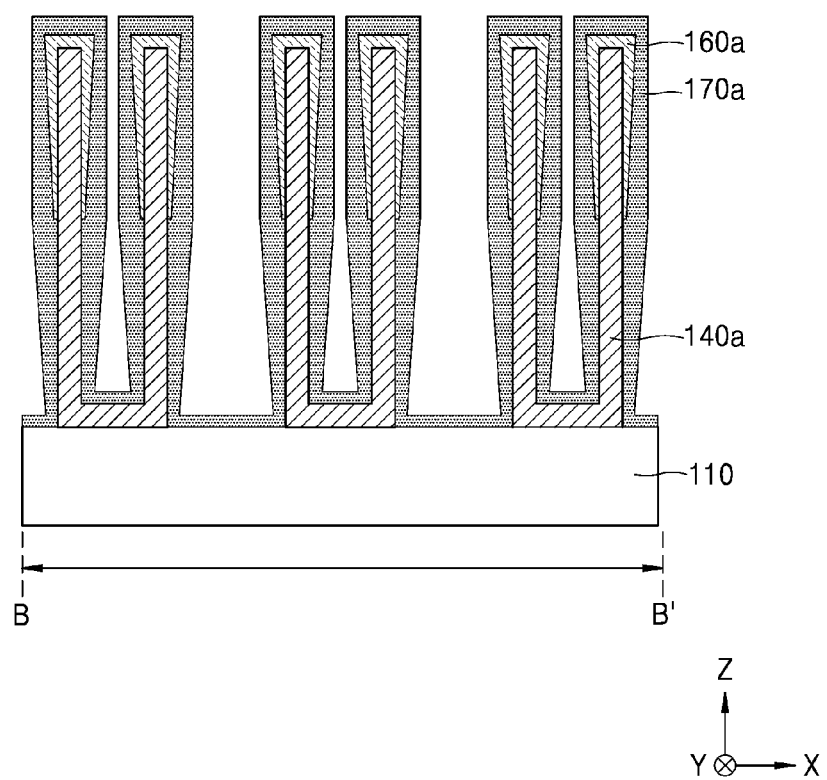

Referring to FIG. 10, a material layer 170a may be formed on the adsorption control layer 160a and the lower portion of the 3D structure 140a. Like the material layer 170 shown in FIG. 5, a growth rate of the material layer 170a on the adsorption control layer 160a may increase toward the lower portion of the 3D structure 140a, and a growth rate of the material layer 170a on the lower portion of the 3D structure 140a may increase toward the upper portion of the 3D structure 140. Accordingly, a thickness of the material layer 170a on the adsorption control layer 160a may increase toward the lower portion of the 3D structure 140a, and a thickness of the material layer 170a on the lower portion of the 3D structure 140a may increase toward the upper portion of the 3D structure 140. Also, a minimum thickness of the material layer 170a on the adsorption control layer 160a may be less than a maximum thickness of the material layer 170a on the lower portion of the 3D structure 140a. That is, a growth rate of the material layer 170a on an upper end of the adsorption control layer 160a may be lower than a growth rate of the material layer 170a on a boundary between the upper portion and the lower portion of the 3D structure 140a.

The methods of manufacturing the semiconductor devices, which have been described above with reference to FIGS. 3A to 10, may be applied to a method of manufacturing a capacitor. For example, the 3D structure 140 or 140a may correspond to a lower electrode and a dielectric layer of a capacitor, and the material layer 170 or 170a may correspond to an upper electrode of the capacitor. Hereinafter, methods of manufacturing capacitors according to embodiments will be described in detail.

FIGS. 11 to 17 are diagrams illustrating a method of manufacturing a capacitor, according to an embodiment.

Figure 11:
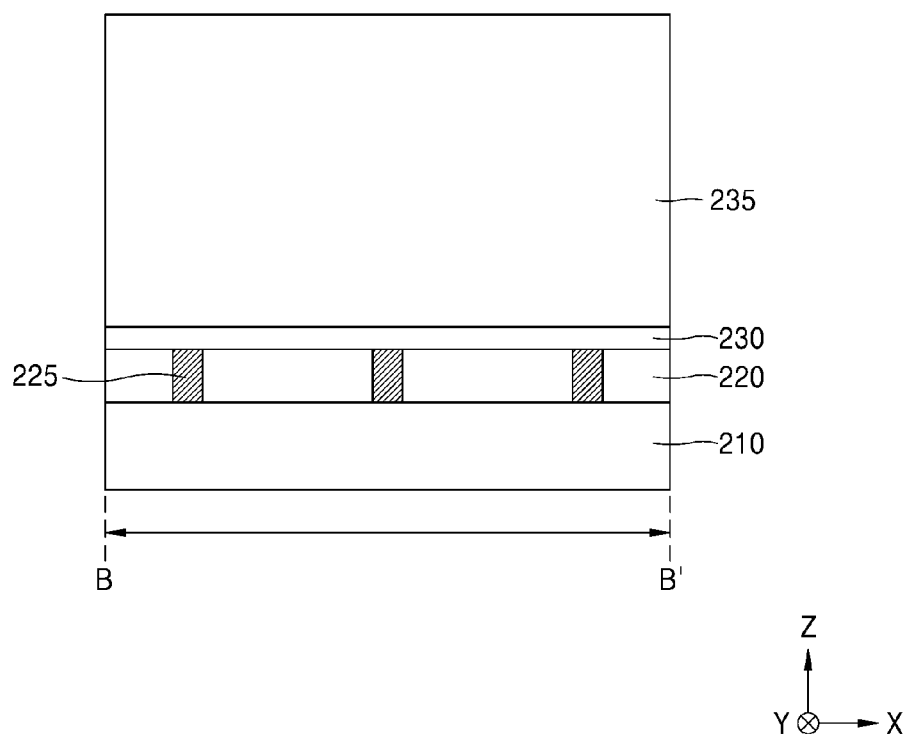
FIGS. 11 to 17 are diagrams of a method of manufacturing a capacitor, according to an embodiment.

Referring to FIG. 11, a substrate 210 may be provided. The substrate 210 may include a semiconductor material, such as a Group-IV semiconductor material, a Group III-V semiconductor material, or a Group II-VI semiconductor material. The Group-IV semiconductor material may include, for example, silicon (Si), germanium (Ge), or silicon germanium (SiGe). The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS). The substrate 210 may be a bulk wafer or an epitaxial layer.

Although not shown in FIG. 11, a plurality of active regions may be formed on the substrate 210 and defined by a device isolation film. A gate structure may be formed on the active regions and the device isolation film. Source and drain regions may be formed in surface portions of the active region adjacent to the gate structure. Thus, a plurality of transistors may be formed on the substrate 210.

Next, an interlayer insulating layer 220 may be formed on the substrate 210. The interlayer insulating layer 220 may cover the plurality of transistors formed on the substrate 210. The interlayer insulating layer 220 may include silicon oxide, silicon nitride, or a combination thereof. The interlayer insulating layer 220 may be formed using, for example, a CVD process.

Thereafter, a contact plug 225 may be formed to penetrate the interlayer insulating layer 220. For example, a hole may be formed to penetrate the interlayer insulating layer 220, and a conductive layer filling the hole may be formed on the interlayer insulating layer 220 using a physical vapor deposition (PVD) process, an ALD process, or a CVD process. An upper portion of the conductive layer may be removed using a chemical mechanical polishing (CMP) process or an etchback process and thus, the contact plug 225 may be formed inside the hole. The contact plug 225 may include a conductive material. For instance, the contact plug 225 may include doped silicon, titanium, tungsten, copper, titanium nitride, tungsten nitride, a metal silicide, or a combination thereof. The contact plug 225 may be electrically connected to the plurality of transistors formed on the substrate 210.

Subsequently, an etch stop layer 230 may be formed on the interlayer insulating layer 220 and the contact plug 225, and a mold layer 235 may be formed on the etch stop layer 230. The etch stop layer 230 may include an insulating material having an etch selectivity with respect to the interlayer insulating layer 220 and the mold layer 235. For example, the etch stop layer 230 may include silicon nitride, while the interlayer insulating layer 220 and the mold layer 235 may include silicon oxide. The etch stop layer 230 may be formed using, for example, a CVD process or a plasma-enhanced CVD (PECVD) process. In some embodiments, the formation of the etch stop layer 230 may be omitted. The mold layer 235 may be formed using, for example, a CVD process or a spin coating process.

Figure 12:
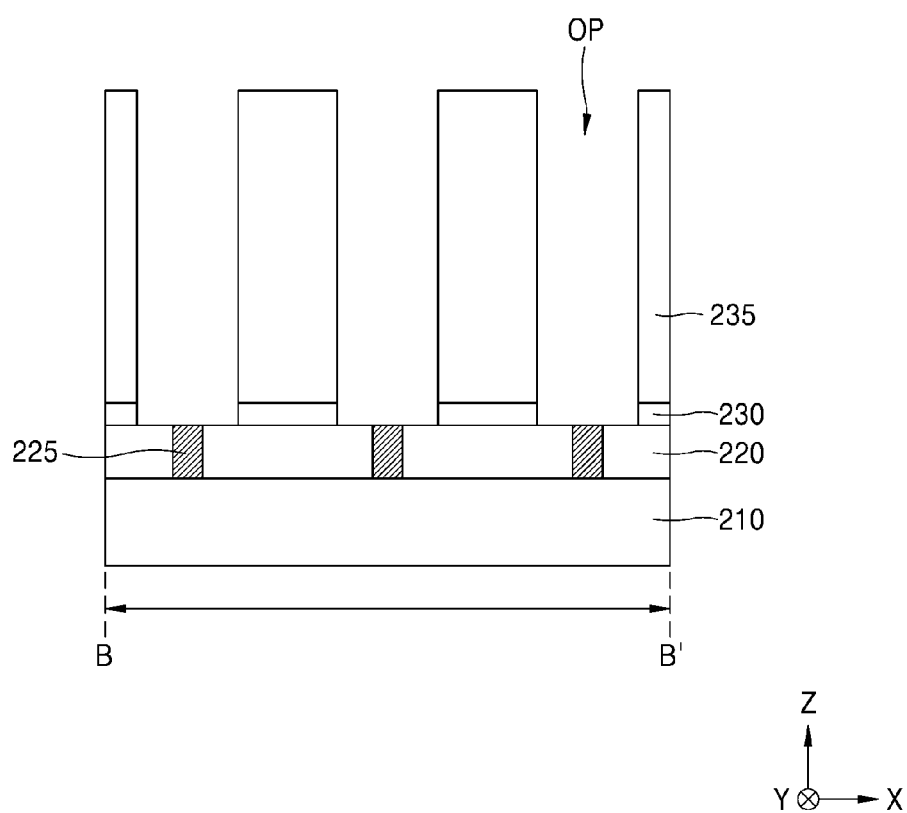

Referring to FIG. 12, the mold layer 235 and the etch stop layer 230 may be partially removed to form a plurality of openings OP. The plurality of openings OP may penetrate the mold layer 235 and the etch stop layer 230 and expose the contact plugs 225. The plurality of openings OP may be formed using a dry etching process or a wet etching process.

Figure 13:
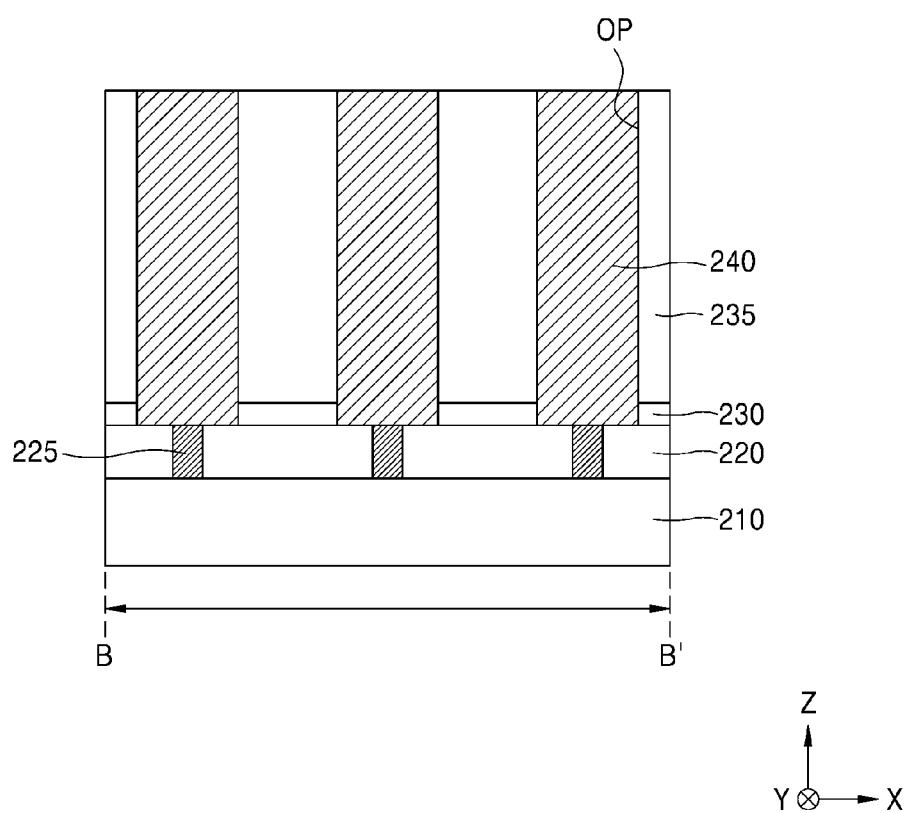

Referring to FIG. 13, a lower electrode 240 may be formed inside the opening OP. For example, a lower electrode layer may be formed to fill the opening OP and cover an upper surface of the mold layer 235. An upper portion of the lower electrode layer may be removed using a CMP process or an etchback process to expose the upper surface of the mold layer 235. Thus, the lower electrode 240 may be formed. In some embodiments, the lower electrode 240 may have a pillar shape. The lower electrode 240 may be surrounded by a plurality of lower electrodes 240 located adjacent thereto. The lower electrode 240 may include a metal, such as copper, aluminum, tungsten, titanium, and tantalum, or a metal nitride, such as titanium nitride, tantalum nitride, and tungsten nitride.

Figure 14:
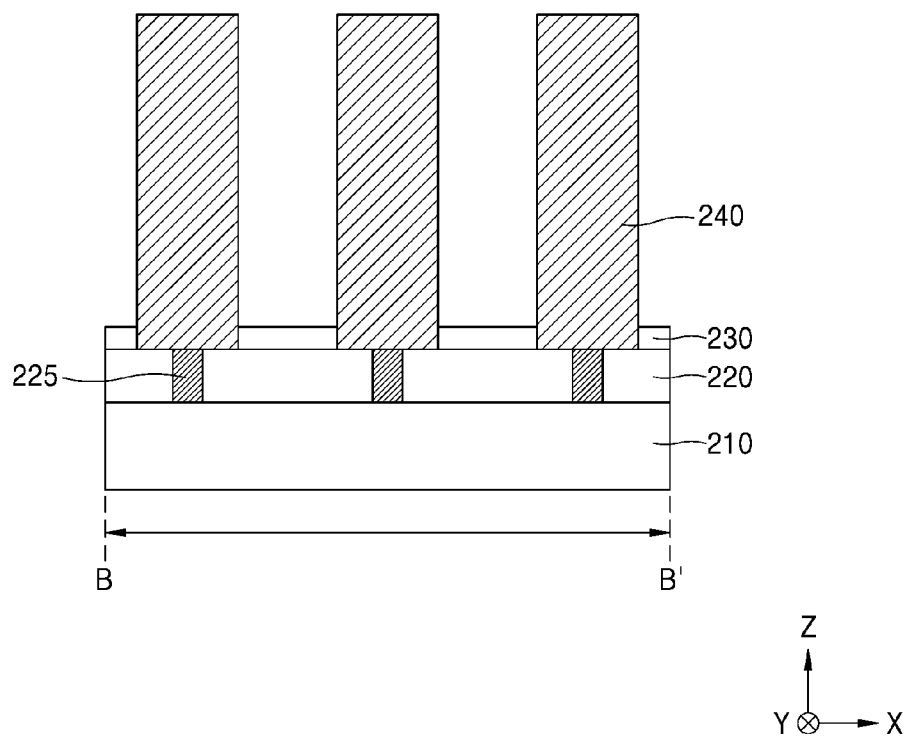

Referring to FIG. 14, the mold layer 235 (refer to FIG. 12) may be removed. For example, the mold layer 235 (refer to FIG. 12) may be removed using a wet etching process.

Figure 15:
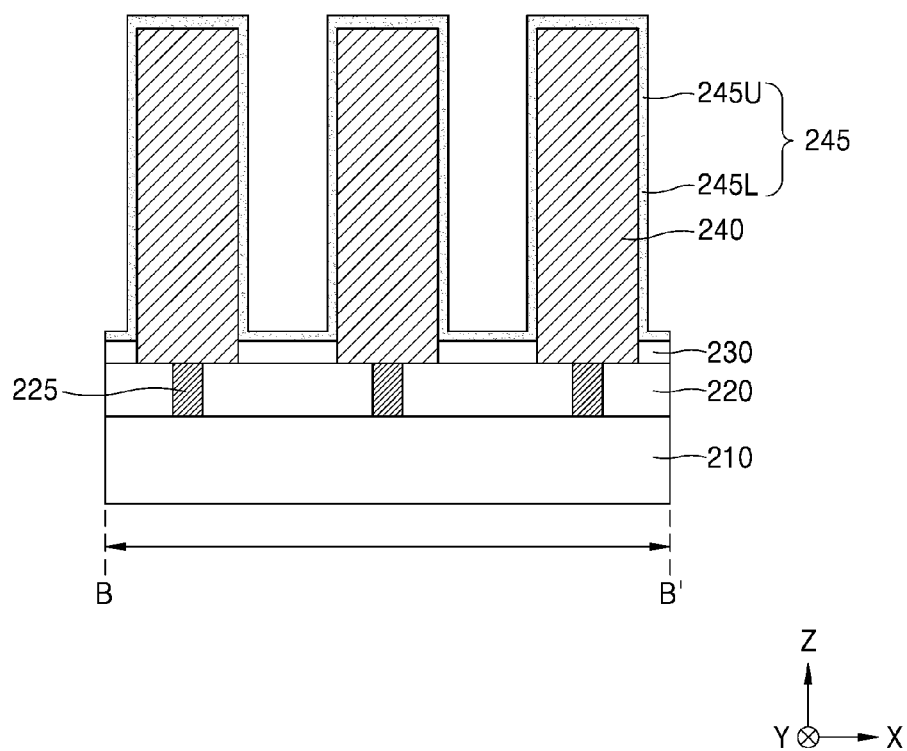

Referring to FIG. 15, a dielectric layer 245 may be formed on the lower electrode 240. The dielectric layer 245 may include a high-k dielectric material. The dielectric layer 245 may include, for example, hafnium oxide ($HfO_2$), zirconium oxide ($ZrO_2$), hafnium silicon oxide (HfSiO), zirconium silicon oxide (ZrSiO), lanthanum oxide ($La_2O_3$), tantalum oxide ($Ta_2O_5$), titanium oxide ($TiO_2$), or a combination thereof. The dielectric layer 245 may be formed using, for example, an ALD process. The dielectric layer 245 may be conformally formed on the lower electrode 240. The dielectric layer 245 may cover an upper surface and side surfaces of the lower electrode 240. The dielectric layer 245 may include a first portion 245U formed on an upper portion of the lower electrode 240 and a second portion 245L formed on a lower portion of the lower electrode 240.

Figure 16:
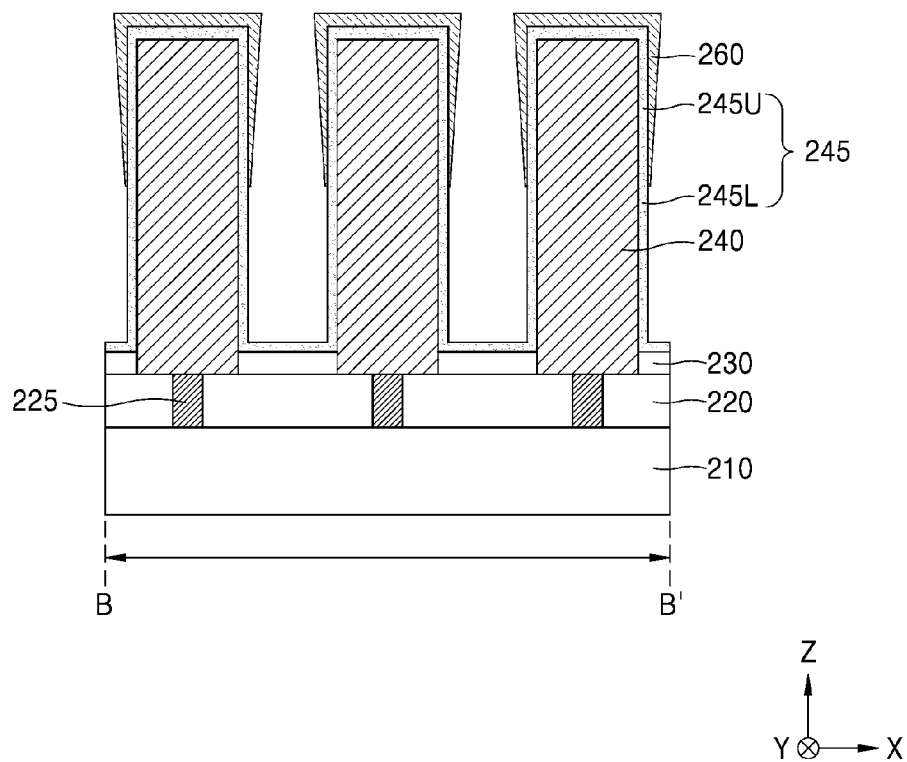

Referring to FIG. 16, an adsorption control layer 260 may be formed on the dielectric layer 245. In some embodiments, the adsorption control layer 260 may include a conductive material, such as graphene (or other 2-D material). The adsorption control layer 260 may be formed only on the first portion 245U of the dielectric layer 245 and may not be formed on the second portion 245L of the dielectric layer 245. For instance, the adsorption control layer 260 having a small thickness may be deposited using a deposition process having a low step coverage and thus, the adsorption control layer 260 may be formed only on the first portion 245U of the dielectric layer 245. In addition, since the supplying of a chemical material for forming the adsorption control layer 260 is reduced toward the lower portion of the lower electrode 240, a growth rate of the adsorption control layer 260 on the first portion 245U of the dielectric layer 245 may be reduced toward the lower portion of the lower electrode 240. Accordingly, a thickness of the adsorption control layer 260 on the first portion 245U of the dielectric layer 245 may be reduced toward the lower portion of the lower electrode 240. That is, the thickness of the adsorption control layer 260 may be reduced toward the substrate 210. A maximum thickness of the adsorption control layer 260 at a position farthest from the substrate 210 may range from, for example, about 10 Å to about 100 Å.

Figure 17:
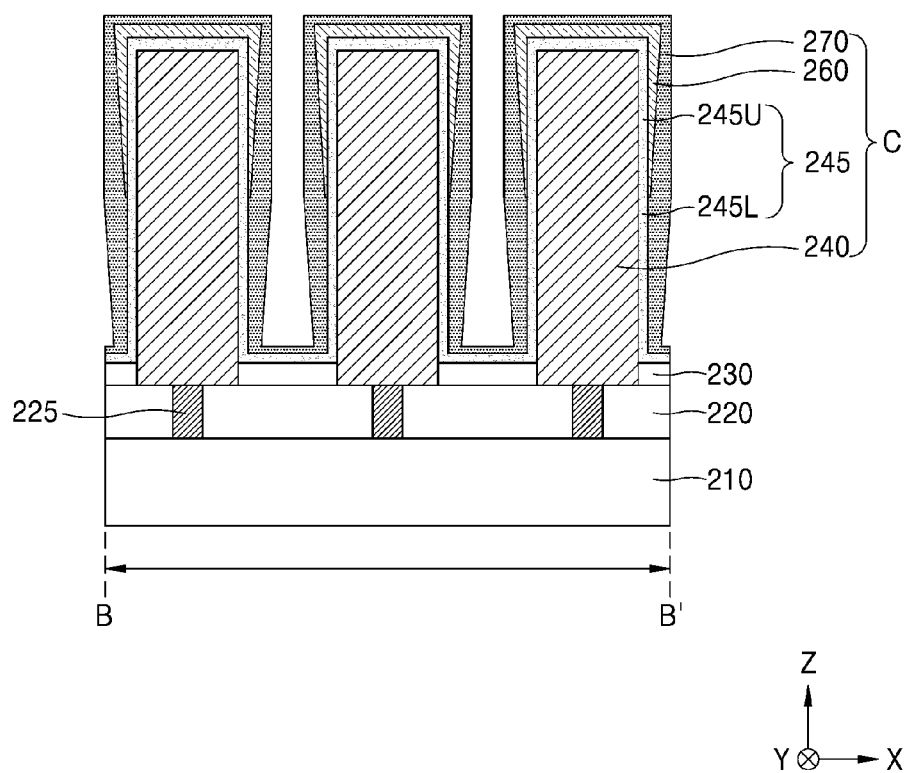

Referring to FIG. 17, an upper electrode 270 may be formed on the adsorption control layer 260 and on the second portion 245L of the dielectric layer 245. The upper electrode 270 may include a metal, such as copper, aluminum, tungsten, titanium, and tantalum, or a metal nitride, such as titanium nitride, tantalum nitride, and tungsten nitride. The upper electrode 270 may be formed using an ALD process. When the upper electrode 270 includes titanium nitride, titanium chloride ($TiCl_4$) and ammonia ($NH_3$) may be used as a source and a reactant.

Since the thickness of the adsorption control layer 260 is reduced toward the lower portion of the lower electrode 240, the number of defects on a surface of the adsorption control layer 260 and the number of adsorption sites may increase toward the lower portion of the lower electrode 240. Thus, a growth rate of the upper electrode 270 on the adsorption control layer 260 may increase toward the lower portion of the lower electrode 240, and a thickness of the upper electrode 270 on the adsorption control layer 260 may increase toward the lower portion of the lower electrode 240. Accordingly, the upper electrode 270 on the adsorption control layer 260 may have a lowest growth rate and a minimum thickness at a position farthest from the substrate 210. Also, the upper electrode 270 on the adsorption control layer 260 may have a highest growth rate and a maximum thickness at a position closest to the substrate 210, that is, at a boundary between the upper portion and the lower portion of the lower electrode 240.

Furthermore, since the supplying of a source gas and a reactant gas is reduced toward a lower end of the lower electrode 240, a growth of the upper electrode 270 on the second portion 245L of the dielectric layer 245 may increase toward the upper portion of the lower electrode 240. Thus, the upper electrode 270 on the second portion 245L of the dielectric layer 245 may have a lowest growth rate and a minimum thickness at a position closest to the substrate 210, that is, on an lower end of the dielectric layer 245. Also, the upper electrode 270 on the second portion 245L of the dielectric layer 245 may have a highest growth rate and a maximum thickness at a position farthest from the substrate 210, that is, at a boundary between the first portion 245U and the second portion 245L of the dielectric layer 245.

In some embodiments, the lowest growth rate and the minimum thickness of the upper electrode 270 on the adsorption control layer 260 may be less than the highest growth rate and the maximum thickness of the upper electrode 270 on the second portion 245L of the dielectric layer 245, due to the fact that a smaller amount of source and/or reactant is adsorbed to the adsorption control layer 260 than to the dielectric layer 245. Here, the lowest growth rate and the minimum thickness of the upper electrode 270 on the adsorption control layer 260 may be a growth rate and a thickness of the upper electrode 270 at a position farthest from the substrate 210, that is, on the upper end of the dielectric layer 245. Also, the highest growth rate and the maximum thickness of the upper electrode 270 on the second portion 245L of the dielectric layer 245 may be a growth rate and a thickness of the upper electrode 270 on the boundary between the first portion 245U and the second portion 245L of the dielectric layer 245.

A capacitor C may be formed by using a method of manufacturing a capacitor according to an embodiment. The capacitor C may include a lower electrode 240, a dielectric layer 245, an adsorption control layer 260, and an upper electrode 270.

In the method of manufacturing the capacitor C according to some embodiments, the adsorption control layer 260 may be formed on the first portion 245U of the dielectric layer 245. Since it is more difficult to adsorb the source gas and/or the reactant gas on the adsorption control layer 260 than on the second portion 245L of the dielectric layer 245, a relatively large amount of source gas and/or reactant gas may be supplied to the second portion 245L of the dielectric layer 245. Thus, a deposition rate of the upper electrode 270 on the adsorption control layer 260 may be lower than a deposition rate of the upper electrode 270 on the second portion 245L of the dielectric layer 245. Accordingly, the upper electrode 270 may be formed to a sufficient thickness even on the second portion 245L of the dielectric layer 245, and a step coverage of the upper electrode 270 may be improved.

FIGS. 18 to 22 are diagrams illustrating a method of manufacturing a capacitor, according to an embodiment.

As described above with reference to FIGS. 11 and 12, a substrate may be provided, a plurality of transistors, an interlayer insulating layer 220, a contact plug 225, an etch stop layer 230, and/or a mold layer 235 may be formed on the substrate, and an opening OP may be formed.

Figure 18:
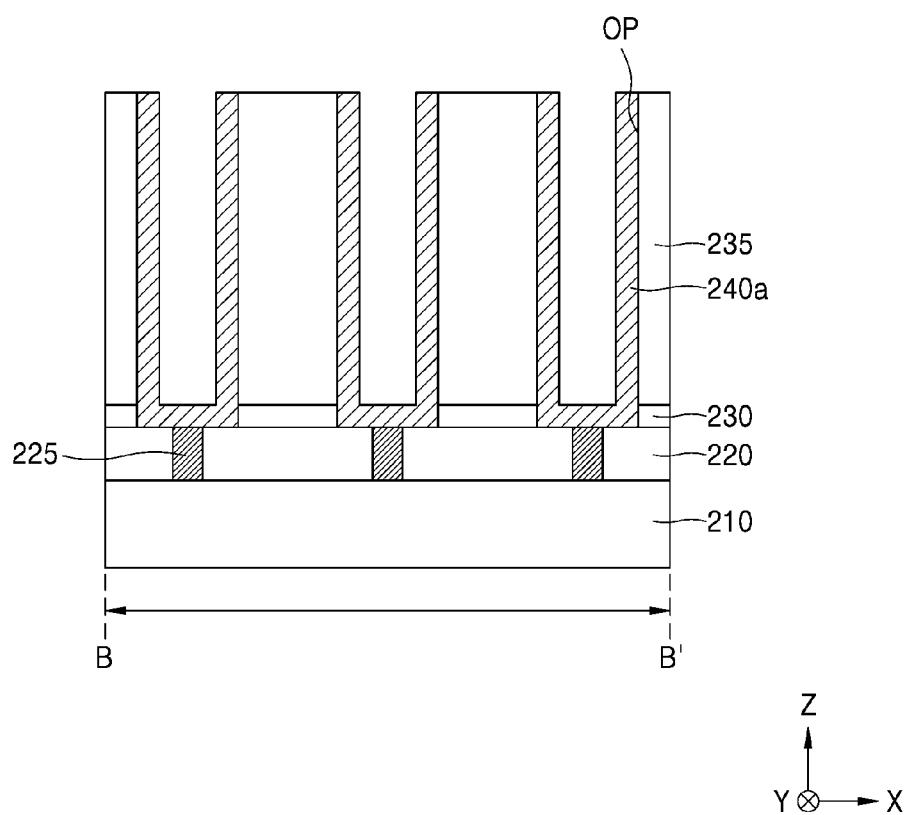
FIGS. 18 to 22 are diagrams of a method of manufacturing a capacitor, according to an embodiment.

Next, referring to FIG. 18, a lower electrode 240a may be formed on a side surface and a bottom surface of the opening OP. For example, a lower electrode layer may be formed to cover the side surface and the bottom surface of the opening OP and an upper surface of the mold layer 235, and an upper portion of the lower electrode layer may be removed using a CMP process or an etchback process to expose the upper surface of the mold layer 235. Thus, the lower electrode 240a may be formed. As a result, the lower electrode 240a may have a hollow pillar shape having a bottom. The lower electrode 240a may include a metal, such as copper, aluminum, tungsten, titanium, and tantalum, or a metal nitride, such as titanium nitride, tantalum nitride, and tungsten nitride.

Figure 19:
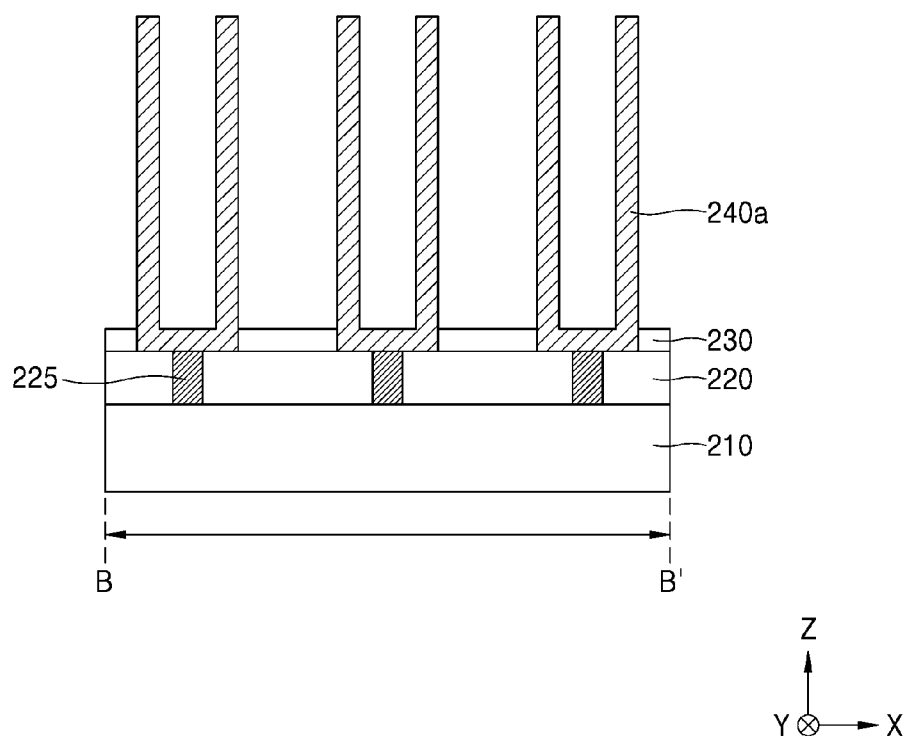

Referring to FIG. 19, the mold layer 235 (refer to FIG. 18) may be removed. The mold layer 235 (refer to FIG. 18) may be removed using a dry etching process or a wet etching process.

Figure 20:
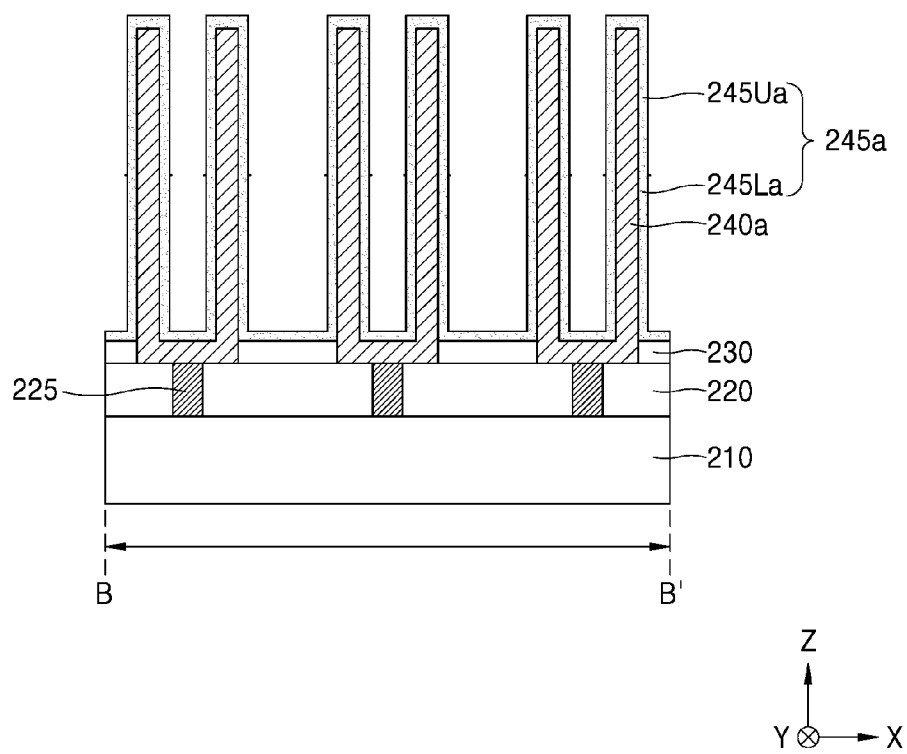

Referring to FIG. 20, a dielectric layer 245a may be formed on the lower electrode 240a. The dielectric layer 245a may include hafnium oxide ($HfO_2$), zirconium oxide ($ZrO_2$), hafnium silicon oxide (HfSiO), zirconium silicon oxide (ZrSiO), lanthanum oxide ($La_2O_3$), tantalum oxide ($Ta_2O_5$), titanium oxide ($TiO_2$), or a combination thereof. The dielectric layer 245a may be conformally formed on the lower electrode 240a. The dielectric layer 245a may cover an upper surface, an outer side surface, an inner side surface, and an inner bottom surface of the lower electrode 240a. The dielectric layer 245a may include a first portion 245Ua formed on an upper portion of the lower electrode 240a and a second portion 245La formed on a lower portion of the lower electrode 240a.

Figure 21:
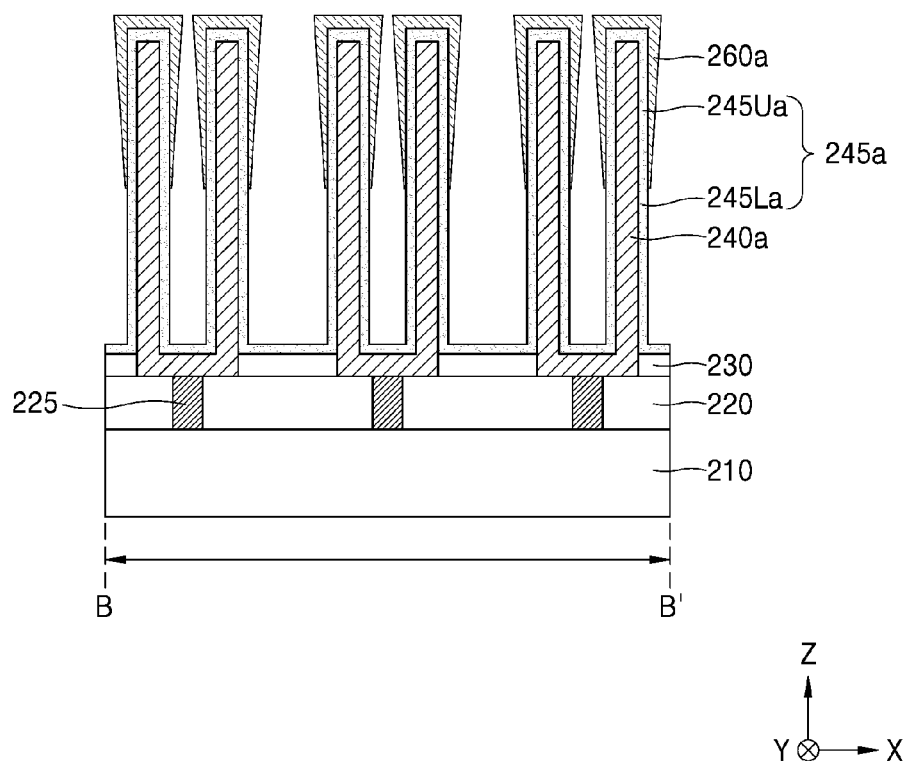

Referring to FIG. 21, an adsorption control layer 260a may be formed on the dielectric layer 245a. As described above with reference to FIG. 15, the adsorption control layer 260a may be formed only on a first portion 245Ua of the dielectric layer 245a and may not be formed on a second portion 245La of the dielectric layer 245a. For example, an adsorption control layer 260a having a small thickness may be deposited using a deposition process having a low step coverage and thus, the adsorption control layer 260a may be formed only on the first portion 245Ua of the dielectric layer 245a. Also, the supplying of a chemical material for forming the adsorption control layer 260a may be reduced toward a lower portion of the lower electrode 240a. Thus, a growth rate of the adsorption control layer 260a on the first portion 245Ua of the dielectric layer 245a may be reduced toward the lower portion of the lower electrode 240a. Accordingly, a thickness of the adsorption control layer 260a on the first portion 245Ua of the dielectric layer 245a may be reduced toward the lower portion of the lower electrode 240a. That is, the thickness of the adsorption control layer 260a may be reduced toward the substrate 210.

Figure 22:
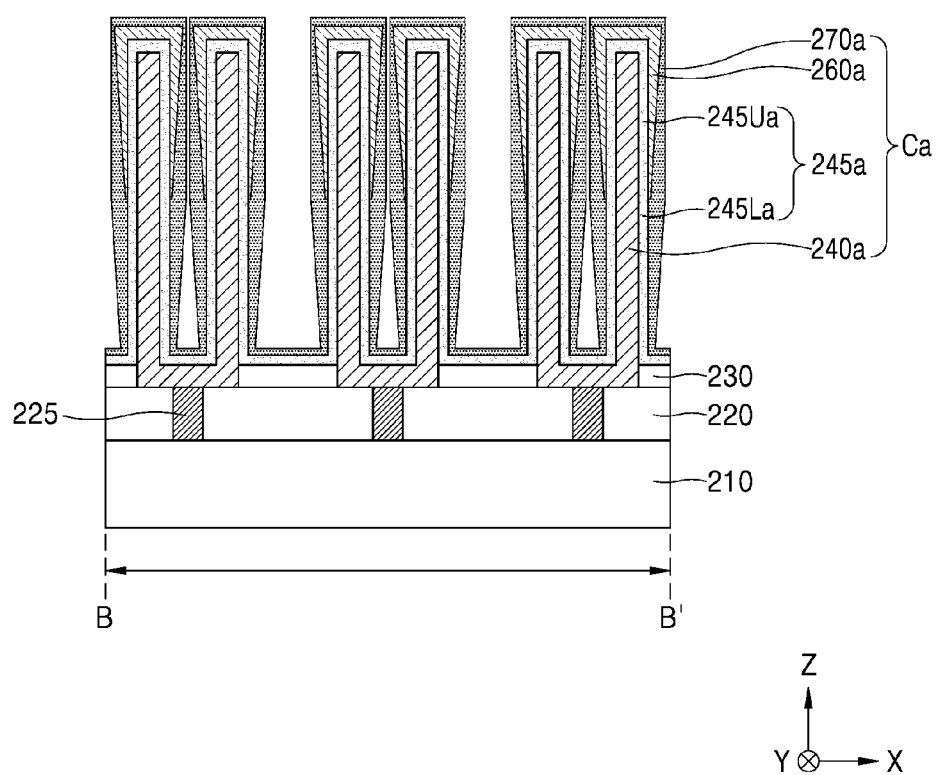

Referring to FIG. 22, an upper electrode 270a may be formed on the adsorption control layer 260a and on the second portion 245La of the dielectric layer 245a. Similar to the upper electrode 270 shown in FIG. 16, a growth of the upper electrode 270a on the adsorption control layer 260a may increase toward the lower portion of the lower electrode 240a, and a growth rate of the upper electrode 270a on the second portion 245La of the dielectric layer 245a may increase toward an upper portion of the lower electrode 240a. Thus, a thickness of the upper electrode 270a on the adsorption control layer 260a may increase toward the lower portion of the lower electrode 240a, and a thickness of the upper electrode 270a on the second portion 245La of the dielectric layer 245a may increase toward the upper portion of the lower electrode 240a. In addition, a lowest growth rate of the upper electrode 270a on the adsorption control layer 260a may be lower than a highest growth rate of the upper electrode 270a on the second portion 245La of the dielectric layer 245a. That is, a growth rate of the upper electrode 270a on an upper end of the adsorption control layer 260a may be lower than a growth rate of the upper electrode 270a on a boundary between the first portion 245Ua and the second portion 245La of the dielectric layer 245a. Accordingly, a minimum thickness of the upper electrode 270a on the adsorption control layer 260a may be less than a maximum thickness of the upper electrode 270a on the second portion 245La of the dielectric layer 245a. That is, a thickness of the upper electrode 270a on the upper end of the adsorption control layer 260a may be less than a thickness of the upper electrode 270a on the boundary between the first portion 245Ua and the second portion 245La of the dielectric layer 245a.

While the inventive concepts have been particularly shown and described with reference to embodiments thereof, it will be understood that various changes in form and details may be made therein without departing from the spirit and scope of the following claims.

What is claimed is:

1. A method of manufacturing a semiconductor device, the method comprising:
    forming a three-dimensional (3D) structure on a substrate;
    forming an adsorption control layer to cover an upper portion of the 3D structure; and
    forming a material layer on the adsorption control layer and on a lower portion of the 3D structure that is not covered by the adsorption control layer,
    wherein an adsorption on the adsorption control layer is less than an adsorption on the lower portion of the 3D structure,
    wherein a minimum thickness of the material layer on the adsorption control layer is less than a maximum thickness of the material layer on the lower portion of the 3D structure.

2. The method of claim 1, wherein the adsorption control layer comprises a two-dimensional (2D) material.

3. The method of claim 2, wherein the adsorption control layer comprises graphene.

4. The method of claim 3, wherein the adsorption control layer is directly formed on the upper portion of the 3D structure.

5. The method of claim 1, wherein the material layer is formed using an atomic layer deposition (ALD) process.

6. The method of claim 1, wherein the 3D structure is surrounded by a plurality of 3D structures adjacent thereto.

7. The method of claim 1, wherein a thickness of the adsorption control layer is reduced toward the lower portion of the 3D structure.

8. The method of claim 7, wherein a thickness of the material layer on the adsorption control layer increases toward the lower portion of the 3D structure.

9. The method of claim 1, wherein a thickness of the material layer on the lower portion of the 3D structure increases toward the upper portion of the 3D structure.

10. The method of claim 1, wherein the 3D structure comprises a lower electrode of a capacitor and a dielectric layer on the lower electrode, and
    the material layer comprises an upper electrode of the capacitor.

11. The method of claim 1, wherein the 3D structure has a pillar shape.

12. The method of claim 1, wherein the 3D structure has a hollow pillar shape having a bottom.

13. A method of manufacturing a semiconductor device, the method comprising:
    forming a lower electrode having a hollow pillar shape with a bottom;
    forming a first portion of a dielectric layer on an upper portion of the lower electrode and forming a second portion of the dielectric layer on a lower portion of the lower electrode;
    forming an adsorption control layer on the first portion of the dielectric layer; and
    forming an upper electrode on the adsorption control layer and on the second portion of the dielectric layer,
    wherein a minimum thickness of the upper electrode on the adsorption control layer is less than a maximum thickness of the upper electrode on the second portion of the dielectric layer.

14. The method of claim 13, wherein the first portion of the dielectric layer is located on an upper surface, an upper portion of an inner side surface, and an upper portion of an outer side surface of the lower electrode.

* * * * *